(12) United States Patent
Kobayashi et al.

(10) Patent No.: US 8,823,073 B2
(45) Date of Patent: Sep. 2, 2014

(54) SEMICONDUCTOR MEMORY DEVICE AND SEMICONDUCTOR MEMORY ELEMENT

(71) Applicants: Naoto Kobayashi, Chiba (JP); Kazuhiro Tsumura, Chiba (JP)

(72) Inventors: Naoto Kobayashi, Chiba (JP); Kazuhiro Tsumura, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 13/628,135

(22) Filed: Sep. 27, 2012

(65) Prior Publication Data

US 2013/0082317 A1 Apr. 4, 2013

(30) Foreign Application Priority Data

Sep. 30, 2011 (JP) ................................. 2011-218241

(51) Int. Cl.
*H01L 27/088* (2006.01)
*H01L 29/788* (2006.01)
*H01L 29/06* (2006.01)
*H01L 21/283* (2006.01)
*H01L 27/115* (2006.01)

(52) U.S. Cl.
CPC ......... *H01L 29/788* (2013.01); *H01L 27/11521* (2013.01); *H01L 29/7885* (2013.01); *H01L 27/088* (2013.01); *H01L 27/11558* (2013.01)
USPC ........... 257/316; 257/315; 257/368; 257/347; 438/296

(58) Field of Classification Search
CPC ............ H01L 27/088; H01L 27/11521; H01L 27/11558; H01L 29/788; H01L 29/7885
USPC ................... 257/316, 401, 402, 404; 438/296
See application file for complete search history.

(56) References Cited

U.S. PATENT DOCUMENTS

| 7,548,460 B2 * | 6/2009 | Diorio et al. ............. 365/185.18 |
| 8,004,032 B1 * | 8/2011 | Bu et al. ......................... 257/315 |
| 2005/0106765 A1 * | 5/2005 | King ................................. 438/14 |
| 2007/0120128 A1 * | 5/2007 | Sato et al. ......................... 257/68 |
| 2007/0246778 A1 * | 10/2007 | Liou et al. ...................... 257/362 |
| 2009/0101940 A1 * | 4/2009 | Barrows et al. ............... 257/204 |
| 2009/0127613 A1 * | 5/2009 | Ikehashi ....................... 257/316 |
| 2009/0134475 A1 * | 5/2009 | Min ............................... 257/402 |
| 2010/0155811 A1 * | 6/2010 | Joo ............................... 257/316 |
| 2011/0182124 A1 * | 7/2011 | Lin et al. .................. 365/185.29 |

FOREIGN PATENT DOCUMENTS

WO 2004006340 1/2004

* cited by examiner

*Primary Examiner* — Shaun Campbell
*Assistant Examiner* — Thai T Vuong
(74) *Attorney, Agent, or Firm* — Adams & Wilks (57) ABSTRACT

A semiconductor memory element has MOS transistor for writing by a drain-avalanche hot electron. The MOS transistor has a semiconductor substrate, a first semiconductor layer formed on the semiconductor substrate, a floating gate provided on the first semiconductor layer through intermediation of a first insulating film, a channel region formed in a surface of the first semiconductor layer under the floating gate, and source region and a drain region provided on the first semiconductor layer so as to be in contact with the channel region. The channel region has a distribution of at least two kinds of carrier densities provided in at least two portions thereof disposed in parallel along a direction connecting the source region and the drain region.

16 Claims, 7 Drawing Sheets

SEMICONDUCTOR MEMORY DEVICE AND SEMICONDUCTOR MEMORY ELEMENT

RELATED APPLICATIONS

This application claims priority under 35 U.S.C. §119 to Japanese Patent Application No. 2011-218241 filed on Sep. 30, 2011, the entire content of which is hereby incorporated by reference.

BACKGROUND OF THE INVENTION

1. Field of the Invention

The present invention relates to a semiconductor memory device and a semiconductor memory element, in particularly, to a non-volatile semiconductor device and a non-volatile semiconductor element.

2. Description of the Related Art

Non-volatile memories are used in various applications, such as storing data of an IC card or the like and tuning of an analog circuit. A memory capacity necessary for such a non-volatile memory is not large; several kilobits to several hundreds of kilobits are sufficient for data storage, and several tens of bits are sufficient for tuning. If a non-volatile memory having such a small memory capacity can be manufactured by a general CMOS process, a CMOS and a non-volatile memory can be mounted together in a single chip without increasing the number of manufacturing steps, and hence the cost can be kept low.

Japanese Patent Publication No. 2005-533372 discloses a non-volatile semiconductor device formed by a CMOS process. In this Patent Application, a P-channel MOS transistor having a floating gate is used as a non-volatile semiconductor element, and electrons are injected into the floating gate by hot electron. Other electron injection methods include Fowler-Nordheim (FN) tunneling injection and hot-electron injection in an N-channel MOS transistor. In both methods, however, a control gate voltage needs to be increased as compared to a P-channel non-volatile semiconductor element. That is, the P-channel non-volatile semiconductor element is superior in that writing can be performed with a low control gate voltage. A low control gate voltage means that a small electric field is applied to a gate oxide film, and hence the P-channel non-volatile semiconductor element is also superior in the reliability of the gate oxide film.

However, the P-channel non-volatile semiconductor element has a problem in that an optimum value of the control gate voltage for writing varies depending on a threshold voltage of the element.

The optimum value of the control gate voltage for writing varies depending on the threshold voltage of the transistor since the writing is performed by drain-avalanche hot electrons (DAHEs). DAHEs are generated when the transistor is in a saturated state, that is, when the channel pinches off. More DAHEs are generated as the position of the pinch-off point is farther from a drain end. That is, the conditions where more DAHEs are generated are that (1) an absolute value of a voltage between the drain and the source is large and that (2) a difference between an absolute value of a voltage between the control gate and the source and an absolute value of the threshold voltage as seen from the control gate is larger than 0 and is close to 0. The optimum value of the control gate voltage for writing varies depending on the threshold voltage of the transistor because of the condition (2).

Controlling the control gate voltage in accordance with the threshold voltage needs a circuit for controlling the control gate voltage and a circuit for monitoring the threshold voltage, which leads to an increase in size of peripheral circuits and is not preferred. Setting a high drain voltage cancels the above-mentioned advantage that the control gate voltage for writing can be set low, which is again not preferred.

From the above, there is a problem in that, if the control gate voltage for writing deviates from an optimum value, the write amount may become insufficient to cause a write failure. Even when the control gate voltage has a value optimum for writing, the threshold voltage as seen from the control gate varies by electron injection into the floating gate for writing. That is, the control gate voltage deviates from the optimum value for writing, and hence sufficient writing may not be performed. Also in the case where an erase operation of removing electrons from the control gate is insufficient or excessive, the control gate voltage deviates from the optimum value for writing, and hence sufficient writing may not be performed.

SUMMARY OF THE INVENTION

The present invention has been made in view of the above-mentioned points, and it is an object thereof to provide a non-volatile semiconductor element which is capable of remarkably increasing a write amount with low voltage and capable of performing stable and sufficient writing without increasing the area of the element and without controlling a control gate voltage in a P-channel non-volatile semiconductor.

In order to solve the above-mentioned problems, according to an exemplary embodiment of the present invention, there is provided a semiconductor memory device, including a plurality of semiconductor memory elements each including a source electrode, a drain electrode, and a floating gate electrode, in which the source electrodes, the drain electrodes, and the floating gate electrodes of the plurality of semiconductor memory elements are respectively short-circuited to one another, and the plurality of semiconductor memory elements have different threshold voltages.

Further, according to another exemplary embodiment of the present invention, there is provided a semiconductor memory element, including a MOS transistor including: a first semiconductor layer of a second conductivity type, which is formed on a semiconductor substrate of a first conductivity type; a floating gate, which is provided on the first semiconductor layer through intermediation of an insulating film; a channel region, which is formed in a surface of the first semiconductor layer under the floating gate; and a source region and a drain region of the first conductivity type, which are provided on the first semiconductor layer so as to be in contact with the channel region, in which the channel region has a distribution of at least two kinds of carrier densities.

Further, there is provided a semiconductor memory element, including a MOS transistor including: a first semiconductor layer of a second conductivity type, which is formed on a semiconductor substrate of a first conductivity type; a floating gate, which is provided on the first semiconductor layer through intermediation of an insulating film; a channel region, which is formed in a surface of the first semiconductor layer under the floating gate; and a source region and a drain region of the first conductivity type, which are provided on the first semiconductor layer so as to be in contact with the channel region, in which the floating gate provided above the channel region has both the first conductivity type and the second conductivity type.

Further, in the semiconductor memory element, the first conductivity type is a P type, the second conductivity type is an N type, and the semiconductor memory element is a P-channel MOS transistor.

Further, in the semiconductor memory device, the semiconductor memory device includes the semiconductor memory element.

The present invention can provide the non-volatile semiconductor element which is capable of remarkably increasing the write amount with low voltage and capable of performing stable and sufficient writing without increasing the area of the element and without controlling the control gate voltage.

DETAILED DESCRIPTION OF THE PREFERRED EMBODIMENTS

Referring to the accompanying drawings, embodiments of the present invention are described in detail below.

Figure 1:
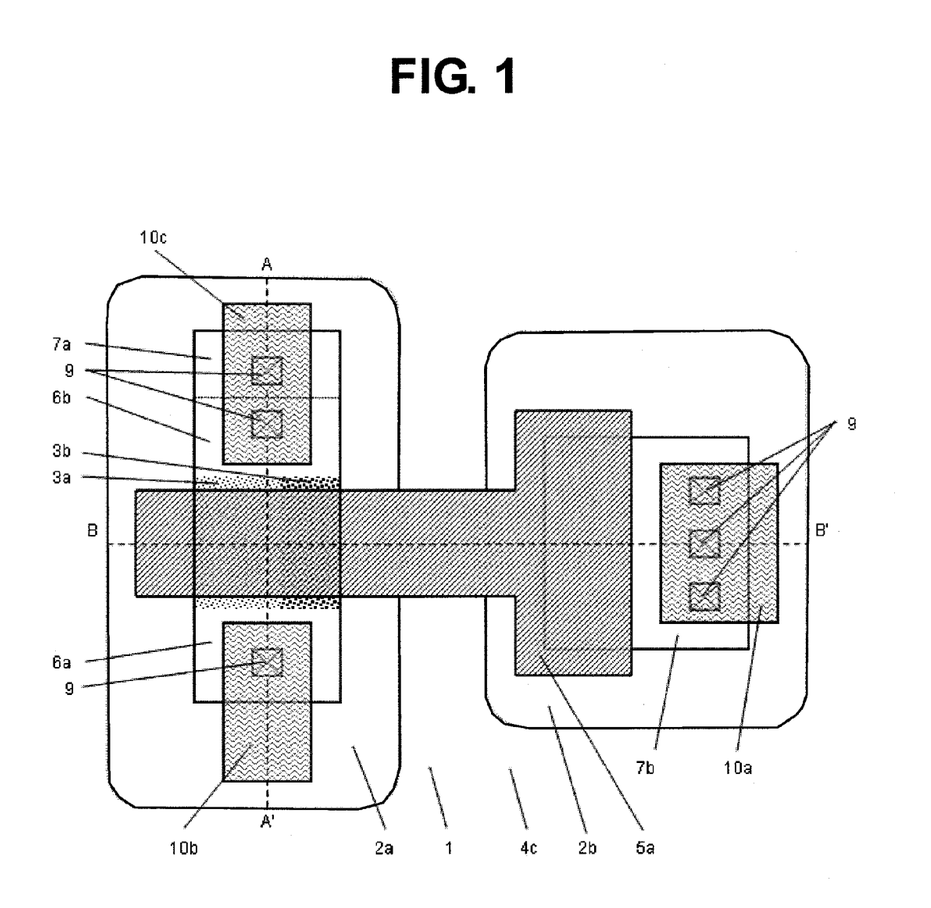
FIG. 1 is a schematic see-through plan view illustrating a configuration of a non-volatile semiconductor element according to an embodiment of the present invention.
Figure 2:
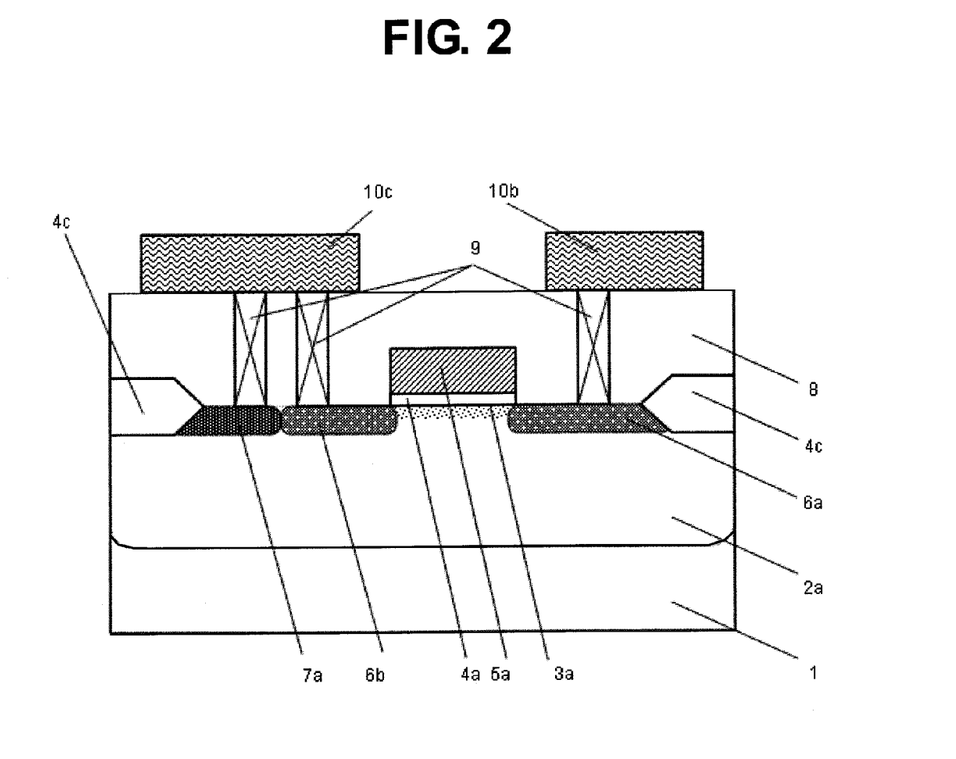
FIG. 2 is a schematic cross-sectional view taken along the line A-A' of the non-volatile semiconductor element illustrated in FIG. 1.
Figure 3:
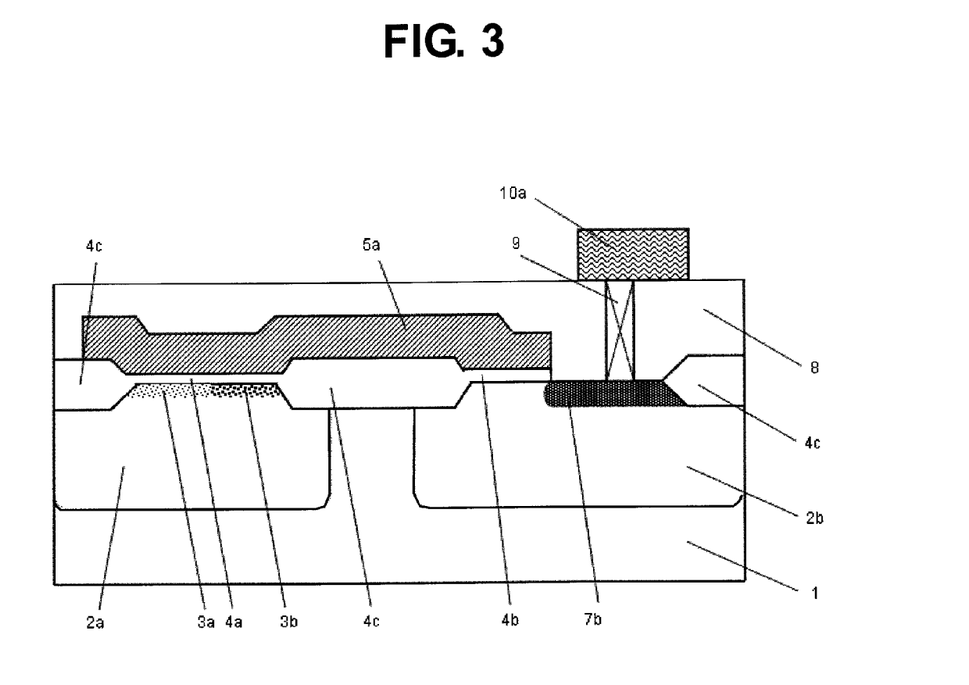
FIG. 3 is a schematic cross-sectional view taken along the line B-B' of the non-volatile semiconductor element illustrated in FIG. 1.

FIG. 1 illustrates a schematic plan view of a non-volatile semiconductor element according to an embodiment of the present invention. FIG. 2 illustrates a schematic cross-sectional view taken along the line A-A' of FIG. 1. FIG. 3 illustrates a schematic cross-sectional view taken along the line B-B' of FIG. 1.

N-type wells $2a$ and $2b$ are formed on a P-type semiconductor substrate 1. The N-type wells $2a$ and $2b$ are electrically isolated from each other by the P-type semiconductor substrate 1 and a field oxide film $4c$ for element isolation formed on a surface portion of the P-type semiconductor substrate 1. In the vicinity of the surface of the N-type well $2a$ (first semiconductor layer), elements of a PMOS transistor are formed, including a P+ diffusion drain region $6a$, a P+ diffusion source region $6b$, an N+ diffusion well contact region $7a$, and a gate electrode $5a$ (floating gate). A gate oxide film $4a$ (first insulating film) is formed between the gate electrode $5a$ and the N-type well $2a$. In the surface of the N-type well $2a$ under the gate electrode $5a$, two channel regions $3a$ and $3b$ having different carrier densities are formed and arranged in a source/drain direction. The channel regions have two kinds of carrier densities, and hence the PMOS transistor has two threshold voltages.

In the vicinity of the surface of the N-type well $2b$, an N+ diffusion well contact region $7b$ is formed and an oxide film $4b$ is formed between the gate electrode $5a$ and the N-type well $2b$. The gate electrode $5a$ is formed of, for example, polycrystalline silicon so that a gate of the PMOS transistor extends continuously up to the top of the oxide film $4b$ on the surface of the N-type well $2b$. The gate electrode $5a$ electrically floats without being connected to another wiring, thereby forming a floating gate electrode. The N-type well $2b$ and the gate electrode $5a$ are capacitively coupled to each other via the oxide film $4b$, and hence a potential of the gate electrode $5a$ can be controlled by a potential of the N-type well $2b$. The N-type well $2b$ therefore serves as a control gate.

On the top of the gate electrode $5a$, the field oxide film $4c$, and the like, an interlayer insulating film 8 (second insulating film) made of, for example, phosphate glass is formed. Further, on the top of the P+ diffusion regions 6 ($6a$, $6b$) and the N+ diffusion regions 7 ($7a$, $7b$), contact regions 9 for connecting electrodes are formed by tungsten, for example. In addition, a control gate electrode $10a$, a PMOS drain electrode $10b$, and a PMOS source electrode $10c$ are formed by metal wiring, for example.

Figure 4:
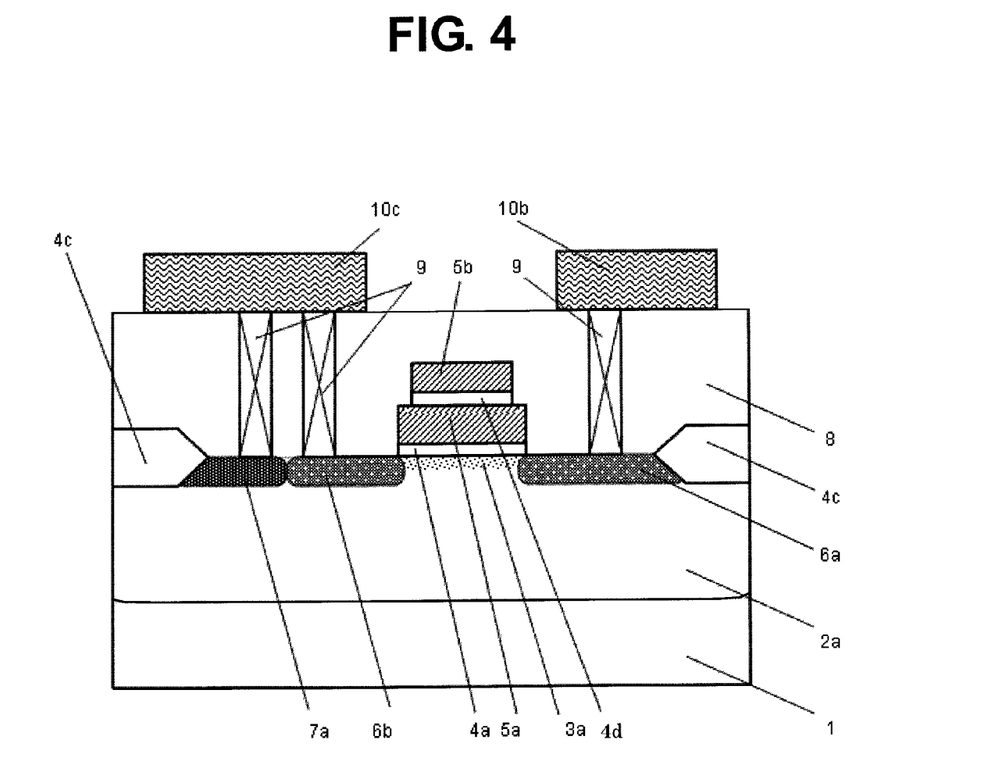
FIG. 4 is a schematic cross-sectional view illustrating a configuration of a non-volatile semiconductor element according to another embodiment of the present invention.

In this case, a well layer is used as the control gate. However, as illustrated in FIG. 4, a second gate electrode $5b$ formed of, for example, polycrystalline silicon may be disposed on the gate electrode $5a$ through the intermediation of an oxide film $4d$, so as to be used as a control gate. In the case of a non-volatile semiconductor for which erase is unnecessary, the control gate may be eliminated.

Figure 5:
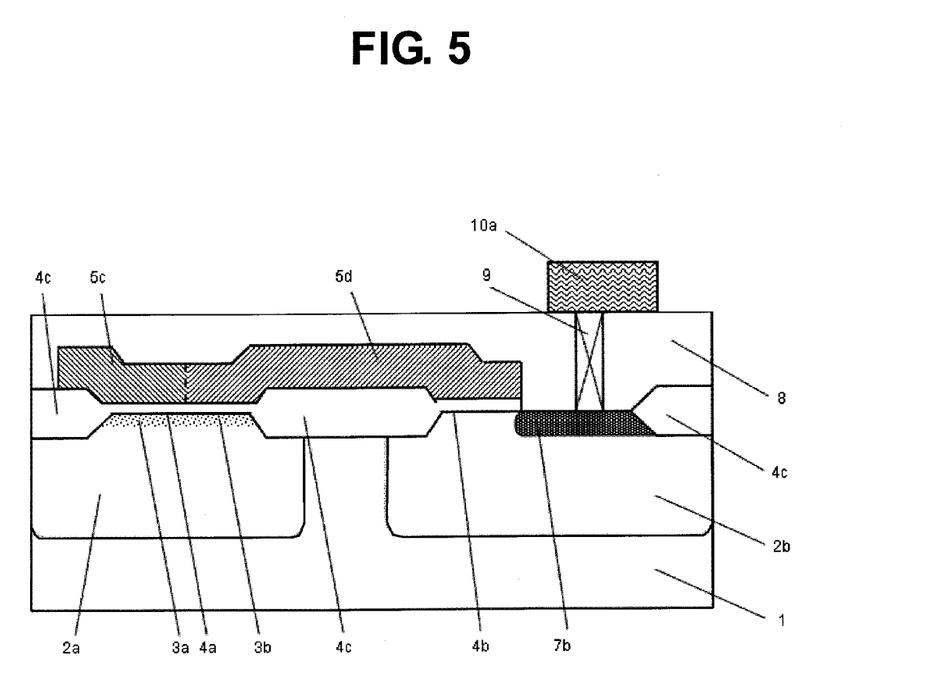
FIG. 5 is a schematic cross-sectional view illustrating a configuration of a non-volatile semiconductor element according to still another embodiment of the present invention.

Two kinds of carrier densities are provided in the channel regions so as to form a PMOS transistor having two kinds of threshold voltages. However, as illustrated in FIG. 5, a P+ gate electrode $5c$ and an N+ gate electrode $5d$ may be formed and arranged continuously in the source/drain direction so that a junction surface between the P+ gate electrode $5c$ and the N+ gate electrode $5d$ is positioned above the channel regions. Also in this case, a PMOS transistor having two kinds of threshold voltages can be formed due to a difference in work function. Alternatively, with the use of both the methods described above, a PMOS transistor having a larger number of threshold voltages can also be formed.

Next, the principle of a write operation of a P-channel non-volatile semiconductor element is described. The principle of the write operation includes drain-avalanche hot electron (DAHE) injection and FN tunneling (FN) injection. The present invention utilizes writing by DAHE injection, and hence only the writing by DAHE injection is described.

First, the writing by DARE injection in the case where the channel region has one kind of carrier density is described with reference to FIG. 6.

Figure 6:
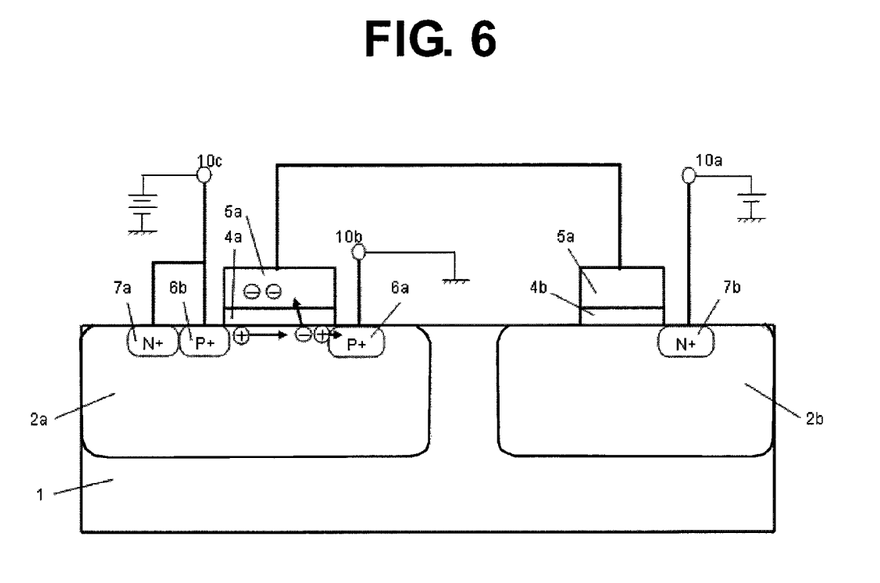
FIG. 6 is a diagram illustrating a write operation of a P-channel non-volatile semiconductor element using hot-electron injection according to the embodiment of the present invention.

FIG. 6 omits the electrodes 10 ($10a$, $10b$, $10c$), and detailed description thereof is omitted by denoting the same reference symbols as in FIGS. 1, 2, and 3. The difference between FIG. 6 and FIGS. 2 and 3 is only the presence or absence of electrons or holes as carriers in the channel region, but otherwise is the same. The voltage of the electrode $10b$ connected to the P+ diffusion drain region $6a$ is maintained to 0 V, the voltage of the electrode $10c$ connected to the P+ diffusion source region 6b and the N+ diffusion region 7a is maintained to a positive high voltage, and the voltage of the control gate electrode 10a connected to the N+ diffusion region 7b is maintained to a positive intermediate voltage. Then, inversion layers are formed at an interface between the N-type well 2a and the gate oxide film 4a and at an interface between the N-type well 2b and the oxide film 4b.

In this case, a positive intermediate voltage which is determined by the ratio of an electrostatic capacitance between the former inversion layer and the gate electrode 5a and an electrostatic capacitance between the latter inversion layer and the gate electrode 5a is generated at the gate electrode 5a. As a result, the PMOS becomes electrically conductive, and the vicinity of the P+ diffusion drain region 6a becomes a high electric field region. Therefore, hot electrons are generated by this electric field.

The hot electrons have high energy and therefore tunnel through the gate oxide film 4a at a certain probability to be injected into the gate electrode 5a, and the gate electrode 5a is charged to be negative. When the hot electrons are generated, hot holes are also generated. However, the holes have a lower probability of tunneling than the electrons, and the gate electrode 5a has a positive potential as seen from the vicinity of the drain region, and hence the electrons are attracted by the gate electrode 5a while the holes are attracted by the drain region 6a, with the result that the injection of electrons becomes dominant. The gate electrode 5a is charged to be negative for writing, and hence the threshold voltage after the writing as seen from the control gate shifts to the positive direction. That is, a shift occurs from the enhancement (normally-OFF) behavior to the depletion (normally-ON) behavior. Such charged state is kept for a long time because the floating gate formed of the gate electrode 5a is electrically insulated from other elements.

In this case, as described above, the conditions where more DAHEs are generated are that (1) an absolute value of a voltage between the drain and the source is large and that (2) a difference between an absolute value of a voltage between the control gate and the source and an absolute value of the threshold voltage as seen from the control gate is larger than 0 and is close to 0. For example, in the case where the drain 6a has 0 V, the source 6b has 8 V, and the threshold voltage as seen from the control gate 7b is −3 V (enhancement behavior because of PMOS), DAHEs are generated most when the voltage of the control gate 7b is set to a value smaller than 5 V and close to 5 V. From the above, the voltage of the control gate 7b is set to an intermediate voltage between the voltage of the source 6b and the voltage of the drain 6a.

Next, an example of the writing using DAHE injection in the case where the channel regions have two kinds of carrier densities is described. First, the carrier densities of the channel regions 3a and 3b are set so that the threshold voltages of the PMOS as seen from the control gate 7b may be −3 V and −6 V. In this configuration, for example, writing is performed with the drain 6a having 0 V, the source 6b having 8 V, and the voltage of the control gate 7b being 4.5 V. At the moment of the writing, more DAHEs are generated in the channel region 3a, and electrons are injected into the gate electrode 5a, with the result that the threshold voltage shifts to the positive direction (depletion behavior).

When the threshold voltage shifts, the amount of generated DAHEs is reduced to lower write efficiency in the channel region 3a. However, the threshold voltage in the channel region 3b also shifts simultaneously with the channel region 3a, and hence, when a shift of about 3 V occurs, more DAHEs are generated in the channel region 3b in turn, and the threshold voltage shifts more to the positive direction.

That is, when two kinds of threshold voltages of the PMOS as seen from the control gate 7b are provided, the shift amount of the threshold voltage increases as compared to the case where one kind of threshold voltage is provided. In other words, write characteristics can be improved.

This method is also applicable to the case where three or more kinds of threshold voltages are provided. For example, even when threshold voltages are set at intervals of −1 V from −3 V to −6 V, and writing is performed so that the shift amount of the threshold voltage becomes −1 V when an initial value of the threshold voltage is −3 V, the threshold voltage ideally shifts by −4 V. As described above, the write amount increases as the drain-source voltage is higher, and hence the writing can be performed with a lower voltage as the number of kinds of threshold voltages is larger.

In the case where a plurality of threshold voltages are provided, by setting the threshold voltages at small intervals, even when the control gate voltage slightly deviates from an intended value, sufficient writing can be performed as long as any one of the thresholds has a value suitable for writing. That is, by providing the plurality of threshold voltages, it is also possible to give a margin to the control gate voltage and the threshold voltage.

Next, a write operation of a P-channel non-volatile semiconductor element having no control gate is described.

Some non-volatile semiconductor elements for which a rewrite operation of repeating erase and write is unnecessary do not have a control gate. An example thereof includes an ultra-violet erasable non-volatile semiconductor element. First, ultra-violet rays are radiated in the wafer state, and electrons accumulated in the gate electrode 5a are erased by a semiconductor wafer process. After a semiconductor IC is assembled in a package, a voltage higher than a normal operating voltage is applied to the non-volatile semiconductor element, to thereby perform writing. Data in this non-volatile semiconductor element cannot be erased unless the semiconductor IC is taken out of the package and is irradiated with ultraviolet rays. That is, this non-volatile semiconductor element serves as a fuse element.

In writing of the P-channel non-volatile semiconductor element having no control gate, for example, the threshold voltage is set to −7.0 V, the drain 6a is set to 0 V, and the source 6b is set to 8 V (the floating gate 5a is 0 V because no charges are held). Those are the conditions where more DAHEs are generated as described above, and hence electrons are injected into the floating gate 5a, thereby performing writing. However, the floating gate 5a is 0 V in the initial state, which is the same potential as that of the drain 6a, and the floating gate 5a cannot attract the electrons. Therefore, write efficiency of electrons is deteriorated as compared to the above-mentioned case where the control gate is provided.

In light of the above, as described as the measures of the present invention, a plurality of threshold voltages are provided so that a plurality of writings are performed substantially by single writing, and hence the write efficiency can be improved. That is, the measures of the present invention are also effective for a P-channel non-volatile semiconductor element having no control gate.

Figure 7:
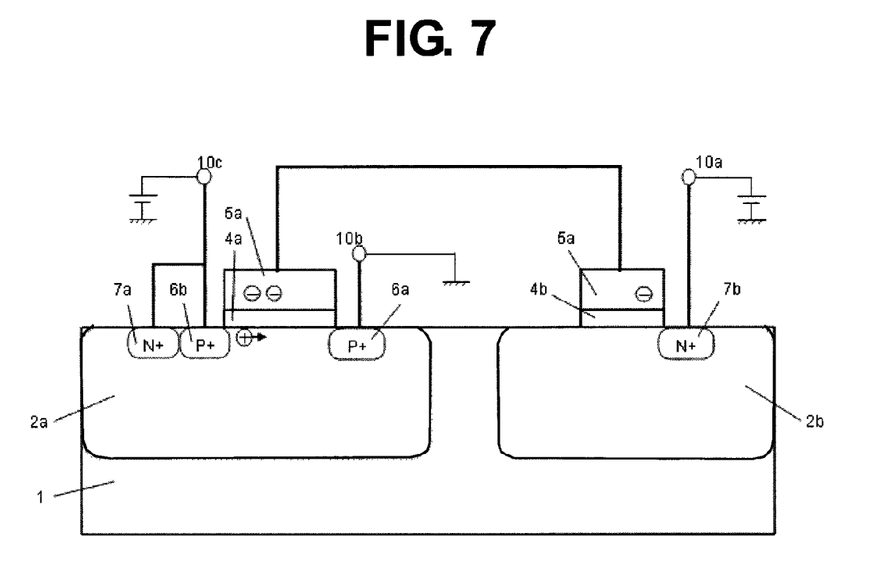
FIG. 7 is a diagram illustrating a read operation of the P-channel non-volatile semiconductor element according to the embodiment of the present invention.

Next, the principle of a read operation of a P-channel non-volatile semiconductor element is described with reference to FIG. 7.

Electrical conductivity of a PMOS transistor varies depending on the amount of electrons of the floating gate electrode 5a. In reading, the voltage of the electrode 10b connected to the P+ diffusion drain region 6a is set to 0 V, and a positive intermediate voltage is applied to the electrode 10c connected to the P+ diffusion source region 6b and the N+ diffusion region 7a and also applied to the control gate electrode 10a connected to the N+ diffusion region 7b. The N-type wells 2a and 2b have the same potential, and hence the potential of the floating gate 5a when no negative charges are present at the floating gate 5a is ideally the same potential as that of the N-type wells 2a and 2b.

When no negative charges are present at the floating gate 5a, the threshold voltages of the PMOS transistor as seen from the control gate are negative in both the channel regions 3a and 3b. Therefore, an inversion layer is not formed at an interface between the N-type well 2a and the gate oxide film 4a, and electrical conduction is not established between the source 6b and the drain 6a. That is, the PMOS transistor becomes an OFF state.

On the other hand, when the floating gate 5a is charged to be negative by the write operation, if the threshold voltage of the PMOS transistor as seen from the control gate is positive in at least one of the channel regions 3a and 3b, an inversion layer is formed at the interface between the N-type well 2a and the gate oxide film 4a. In this case, a positive intermediate voltage which is determined by the ratio of an electrostatic capacitance between an inversion layer of the N-type well 2a and the gate electrode 5a and an electrostatic capacitance between an inversion layer of the N-type well 2b and the gate electrode 5a is generated at the gate electrode 5a. As a result, electrical conduction is established between the source 6b and the drain 6a, and the PMOS transistor becomes an ON state. The ON/OFF state of the PMOS transistor can be detected in this manner, and hence data can be read.

From the above, in a PMOS non-volatile semiconductor having a plurality of threshold voltages, all the threshold voltages in the case where no charges are present at the floating gate 5a need to be negative. As exemplified in the write operation, in the case where a plurality of threshold voltages are provided, the initial values of the threshold voltages are all negative, and a threshold voltage in a channel region where the first write operation occurs is set to be highest (closer to 0). Therefore, the read operation is not affected at all. Further, the ON state can be detected as long as a current path is formed in at least one channel region, and hence it is unnecessary to set all the threshold voltages to be positive in writing.

Next, erase operations of a P-channel non-volatile semiconductor element are described with reference to FIGS. 8 and 9. Two kinds of erase operations are available, both of which utilize FN tunneling.

Figure 8:
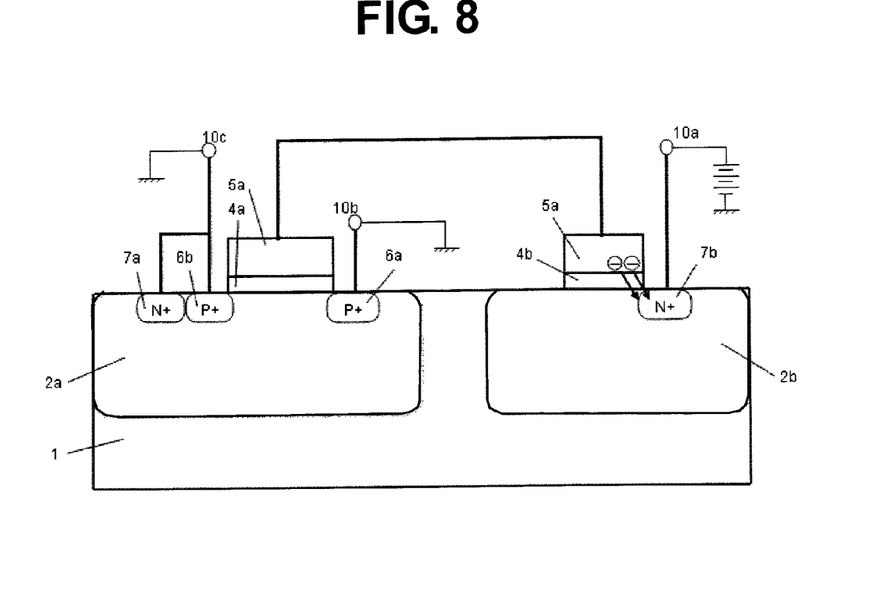
FIG. 8 is a diagram illustrating an erase operation of the P-channel non-volatile semiconductor element using a control gate according to the embodiment of the present invention.

FIG. 8 illustrates an erase operation using a control gate. When the voltages of the drain electrode 10b and the source electrode 10c are set to 0 V, and a high voltage is applied to the control gate electrode 10a, a high electric field is generated between the floating gate 5a and the N+ diffusion region 7a so that an FN tunnel current flows. As a result, the charges of the floating gate 5a are removed, to thereby erase data.

Figure 9:
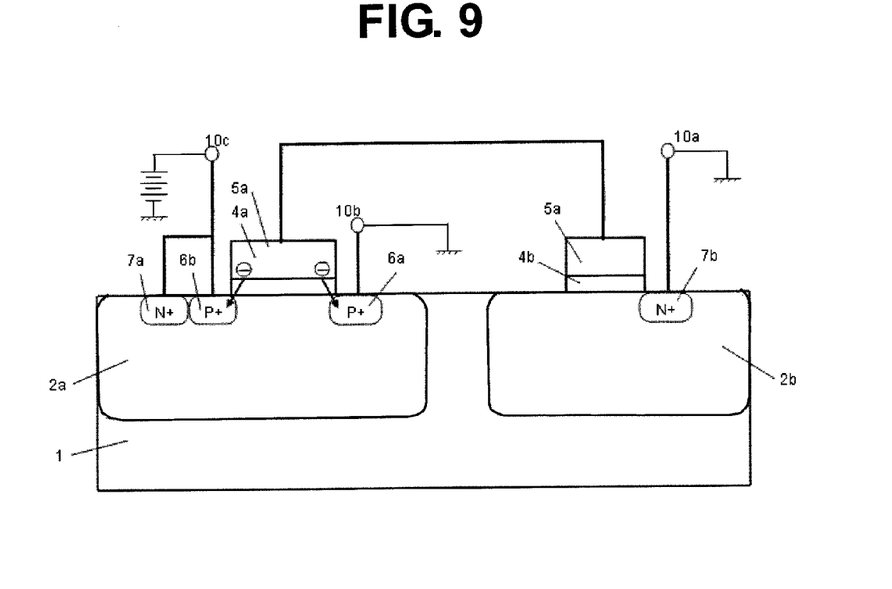
FIG. 9 is a diagram illustrating an erase operation of the P-channel non-volatile semiconductor element using a PMOS transistor according to the embodiment of the present invention.

FIG. 9 illustrates an erase operation using a PMOS transistor. When the voltage of the control gate electrode 10a is set to 0 V, and a high voltage is applied to the drain electrode 10b and the source electrode 10c, a high electric field is generated between the floating gate 5a and the P+ diffusion regions 6a and 6b so that an FN tunnel current flows. As a result, the charges of the floating gate 5a are removed, to thereby erase data. Also in the case where the control gate is not provided, data can be erased by this method.

The embodiments of the present invention have been described above by way of specific examples. The present invention is, however, not limited to the specific examples. For example, even in the case of an N-channel non-volatile semiconductor element, the present invention can provide the same action and effect in principle. Further, the carrier densities of the channel regions and the polarities of the gate electrode are formed in a stepwise manner in order to give a plurality of threshold voltages, but the same action and effect can be obtained even when the carrier densities and the polarities are formed in a slope manner.

As described above in detail, the present invention can provide a non-volatile semiconductor element, which is capable of remarkably increasing the write amount with low voltage and capable of performing stable and sufficient writing, without increasing the area of the element and without controlling a control gate voltage.

What is claimed is:

1. A semiconductor memory element comprised of a MOS transistor for writing by a drain-avalanche hot electron, the MOS transistor comprising:
   a semiconductor substrate;
   a first semiconductor layer of an N type formed on the semiconductor substrate;
   a floating gate provided on the first semiconductor layer through intermediation of a first insulating film;
   a channel region formed in a surface of the first semiconductor layer under the floating gate; and
   a source region and a drain region of a P type provided on the first semiconductor layer so as to be in contact with the channel region;
   wherein the channel region has at least two portions disposed in parallel along a direction connecting the source region and the drain region, the at least two portions having different threshold voltages against the floating gate that are set so that in a write operation, hot electrons are generated in a vicinity of the drain region and in each of the at least two portions at different bias conditions.

2. A semiconductor memory element according to claim 1, wherein the at least two portions of the channel region have a distribution of at least two different kinds of carrier densities.

3. A semiconductor memory element according to claim 1, wherein the floating gate is provided above the channel region and has both a P-type conductivity and an N-type conductivity.

4. A semiconductor memory element according to claim 1, wherein the at least two portions of the channel region have a distribution of at least two different kinds of carrier densities and the floating gate is provided above the channel region and has both a P-type conductivity and an N-type conductivity.

5. A semiconductor memory element according to claim 1, further comprising:
   a second semiconductor layer of the N type formed on the semiconductor substrate; and
   a second insulating film provided on the second semiconductor layer;
   wherein the floating gate extends up to a region on the second insulating film, and the second semiconductor layer functions as a control gate for controlling a potential of the floating gate.

6. A semiconductor memory element according to claim 1, wherein the floating gate has one of a top surface and a side surface on which a control gate is formed through intermediation of an insulating film.

7. A semiconductor memory element according to claim 5, wherein the floating gate has one of a top surface and a side surface on which a control gate is formed through intermediation of an insulating film.

8. A semiconductor memory device having the semiconductor memory element according to claim 1.

9. A semiconductor memory device having the semiconductor memory element according to claim 5.

10. A semiconductor memory element comprising: a MOS transistor having a semiconductor substrate, a first semiconductor layer formed on the semiconductor substrate, a floating gate provided on the first semiconductor layer through intermediation of a first insulating film, a channel region formed in a surface of the first semiconductor layer under the floating gate, and a source region and a drain region provided on the first semiconductor layer so as to be in contact with the channel region, the channel region having a distribution of at least two kinds of carrier densities provided in at least two portions thereof disposed in parallel along a direction connecting the source region and the drain region.

11. A semiconductor memory element according to claim 10, wherein the first semiconductor layer has an N-type conductivity and the source and drain regions have a P-type conductivity.

12. A semiconductor memory element according to claim 10, further comprising a second semiconductor layer formed on the semiconductor substrate and a second insulating film provided on the second semiconductor layer; wherein the floating gate extends up to a region on the second insulating film, and the second semiconductor layer functions as a control gate for controlling a potential of the floating gate.

13. A semiconductor memory element according to claim 12, wherein the floating gate has one of a top surface and a side surface on which a control gate is formed through intermediation of an insulating film.

14. A semiconductor memory device having the semiconductor memory element according to claim 12.

15. A semiconductor memory element according to claim 10, wherein the floating gate has one of a top surface and a side surface on which a control gate is formed through intermediation of an insulating film.

16. A semiconductor memory device having the semiconductor memory element according to claim 10.

* * * * *